United States Patent [19]

Uemura

[11] Patent Number: 5,383,217
[45] Date of Patent: Jan. 17, 1995

[54] EXPOSURE APPARATUS WITH LASER SOURCE REQUIRING NEW GAS INTRODUCTION

[75] Inventor: Tsunesaburo Uemura, Tokyo, Japan

[73] Assignee: Nikon Corporation, Tokyo, Japan

[21] Appl. No.: 209,367

[22] Filed: Mar. 14, 1994

Related U.S. Application Data

[63] Continuation of Ser. No. 71,368, Jun. 3, 1993, abandoned, which is a continuation of Ser. No. 911,260, Jul. 15, 1992, abandoned, which is a continuation-in-part of Ser. No. 780,849, Oct. 23, 1991, abandoned, which is a continuation of Ser. No. 520,878, May 9, 1990, abandoned.

[30] Foreign Application Priority Data

May 9, 1989 [JP] Japan ................................. 1-115361

[51] Int. Cl.⁶ .............................................. H01S 3/22
[52] U.S. Cl. ........................................ 372/58; 372/33; 372/29
[58] Field of Search ..................... 372/30, 59, 29, 58, 372/33

[56] References Cited

U.S. PATENT DOCUMENTS

| | | | |
|---|---|---|---|
| 3,806,829 | 4/1974 | Duston et al. | 372/25 |
| 4,429,392 | 1/1984 | Yoshida et al. | 372/58 |
| 4,630,373 | 12/1986 | Inoue et al. | 372/38 |
| 4,916,707 | 4/1990 | Rosenkranz | 372/58 |
| 4,935,937 | 6/1990 | Yamazaki et al. | 372/58 |
| 4,937,837 | 6/1990 | Iehisa | 372/58 |
| 4,956,846 | 9/1990 | Iehisa | 372/58 |
| 5,109,388 | 4/1992 | Rudko | 372/58 |

Primary Examiner—Léon Scott, Jr.
Attorney, Agent, or Firm—Shapiro and Shapiro

[57] ABSTRACT

An exposure apparatus, such as a stepper, uses a laser light source requiring new gas introduction from time to time. The timing of new gas addition and partial gas replacement is controlled so that the exposure apparatus is not adversely affected. In one embodiment, the timing is such that gas introduction or replacement occurs during interruption of exposure operation, which does not start again until the fluctuation of the output of laser light caused by gas introduction or replacement is stabilized.

19 Claims, 11 Drawing Sheets

EXPOSURE APPARATUS WITH LASER SOURCE REQUIRING NEW GAS INTRODUCTION

This is a continuation of application Ser. No. 071,368 filed Jun. 3, 1993, which is a continuation of application Ser. No. 911,260 filed Jul. 15, 1992, which is a continuation-in-part of application Ser. No. 780,849 filed Oct. 23, 1991, which is a continuation of Ser. No. 520,878 filed May 9, 1990, all abandoned.

BACKGROUND OF THE INVENTION

Field of the Invention

This invention relates to an exposure apparatus for the manufacture of semiconductors which uses as an exposure light source a laser such as an excimer laser requiring gas replacement, gas charge or the like.

Related Background Art

In recent years, an increase in the degree of integration of semiconductive integrated circuits has led to smaller minimum pattern dimensions of the circuit and therefore, there has been developed an exposure apparatus using an excimer laser instead of the mercury lamp which has heretofore been the standard light source. The excimer laser exposure apparatus is generally comprised of an excimer laser source and an exposure apparatus body, and as the exposure apparatus body, the reduction projection type successive movement system, i.e., the so-called stepper, is nowadays conventional because of its excellence in resolving power and mask manufacturing property. A popular excimer laser exposure apparatus is one in which the excimer laser and the exposure apparatus body are coupled together by an electric wire or an interface cable of optical fiber and the laser is caused to emit light in accordance with the sequence of a main computer in the exposure apparatus body. As the signal of the interface, mention may be made, for example, of a signal from the exposure apparatus body to the excimer laser which is representative of light emission trigger, starting of high voltage charging, starting of oscillation, stoppage of oscillation, etc., or a signal from the excimer laser to the exposure apparatus body which is representative of completion of oscillation standby, internal shutter position, interlocking operation, etc.

The excimer laser generally uses mixed gas comprising three kinds of gases, i.e., halogen gas such as fluorine, inert gas such as krypton or argon, and rare gas such as helium or neon is enveloped in a laser chamber and the halogen gas and the inert gas react to cause a discharge in the chamber to thereby emit laser light (a light pulse of nsec order. However, while the emission of the laser light is repeated, the halogen gas is coupled to impurities created in the chamber or is adsorbed to the inner side of the chamber and therefore, the concentration of the halogen gas is reduced and the pulse energy of the laser is reduced. Where the excimer laser is used as the light source of a semiconductor exposure apparatus, any fluctuation of pulse energy results in the following problems:

(1) The control accuracy of energy (exposure amount) arriving at an object to be exposed (such as a wafer) is reduced;

(2) The function of reducing the interference fringes on the object to be exposed which are attributable to an optical system is reduced; and (3) The S/N ratio of the signal of the photoelectric detecting system of a pulse energy monitoring system or an alignment system is reduced.

Therefore, the excimer laser is designed such that the pulse energy reduced by a reduction in the concentration of the halogen gas is monitored and fed-back to an applied voltage for discharge and the applied voltage for discharge is gradually heightened, thereby keeping the pulse energy constant. However, there is an upper limit in the applied voltage for discharge and therefore, it has been necessary that when the applied voltage reaches the upper limit, the HI (halogen injection) operation be performed to restore the concentration of the halogen gas to a proper value and along therewith, the applied voltage be reduced to keep the pulse energy constant.

The state of this HI operation is shown in FIG. 3 of the accompanying drawings.

FIG. 3(A) is a graph in which the pulse energy emitted from the excimer laser is plotted as the vertical axis and time t is plotted as the horizontal axis, and FIG. 3(B) is a graph in which the applied voltage for discharge to an electrode in the laser chamber is plotted as the vertical axis and time t is plotted as the horizontal axis. As shown in FIG. 3(A), when the allowable upper value and the allowable lower value are determined, about the set value of the pulse energy required on the exposure apparatus side, the magnitude of the excimer laser source pulse energy is compared with the set value for each pulse by the use of an energy monitor (such as a light receiving element provided within the excimer laser source), and when the pulse energy begins to be reduced, the applied voltage for discharge is gradually increased as shown in FIG. 3(B). The applied voltage for discharge also has upper value and a lower value determined therefor, and the actual voltage range thereof differs depending on the internal structure of the excimer laser source, the maker, etc. Now, when at time $t_1$, the applied voltage for discharge reaches the upper value, a control processor provided within the excimer laser source judges that the HI operation is necessary, and injects a predetermined quantity of halogen gas into the laser chamber. Immediately after the injection, the concentration of the halogen gas restored to its original level, but the applied voltage for discharge cannot be suddenly restored (reduced) to its original level. At time $t_2$ thereafter, the HI operation is likewise performed.

The reason why the applied voltage for discharge must be gradually reduced is that immediately after the HI operation, the gases in the laser chamber cannot be said to be mixed sufficiently uniformly and the possibility of the pulse energy becoming irregular is very great and therefore, if the applied voltage for discharge is suddenly reduced immediately after the HI operation, no pulse light will be oscillated and this may result in the problem that even power monitoring cannot be accomplished.

When the halogen injection is repeated, impurities in the laser chamber begin to increase.

If the injection of halogen gas is effected with such an increase in the impurities, the halogen gas is coupled to these impurities (the concentration of the halogen gas is reduced) and the applied voltage for discharge for keeping the pulse energy constant rises. Thereby, the period of the halogen gas injection becomes shorter and soon, even if the halogen gas injection is effected, it will become impossible to keep the pulse energy constant.

FIGS. 4(A) and (B) of the accompanying drawings show that state, and correspond to the graphs of FIG. 3. As shown in FIG. 4(B), the injection period becomes gradually shorter at times $t_1, t_2, \ldots, t_6$, and after the time $t_6$, in spite of the applied voltage for discharge being at the upper value, the pulse energy is gradually reduced.

When the effect of the halogen gas injection has thus become nil or when it has been reduced to a predetermined condition, it has been necessary to partially replace the aforementioned mixed gas comprising three kinds of gases, i.e., execute the PGR (partial gas replacement) operation, thereby maintaining the pulse energy. An example of the state during the execution of the partial gas replacement is shown in FIG. 5 of the accompanying drawings. The state of variations in the pulse energy and the applied voltage for discharge when the partial gas replacement is effected along with FIG. 5 will be described below.

FIGS. 5(A) and (B) correspond to FIGS. 4(A) and (B), respectively, and times $t_3, t_4$ and $t_5$ in FIGS. 5(A) and (B) are the same as those in FIG. 4 and represent the timings of the HI operation. At time Ta after the time $t_5$, the PGR operation is executed.

At this time, the applied voltage for discharge has already come near the upper value as previously described and therefore, it is difficult to increase the applied voltage and restore the pulse energy to its set value. Therefore, a predetermined quantity of new mixed gas is injected into the laser chamber. By this injection, the pulse energy is increased and substantially exceeds the set value (exceeds the allowable upper value) and therefore, the applied voltage is gradually reduced to thereby restore the pulse energy to the set value. Thereafter, as in FIG. 3, the halogen injection (HI) operation is repeated until the partial gas replacement becomes necessary again.

The reason why the applied voltage is gradually reduced during this PGR replacement operation is also the same as that during the aforedescribed HI operation.

The above-described HI operation and PGR operation have been substantially automatically performed by the command of a control processor in the excimer laser source.

When the excimer laser source is viewed from the exposure apparatus body side, it is desirable that the pulse energy be constant as previously described, but it is difficult to make the pulse energy completely constant, because of such factors as the accuracy of control of pulse energy, the above-described halogen injection and the partial gas replacement. Therefore, on the exposure apparatus body side, the allowable value of pulse energy fluctuation for satisfying satisfactory operation is set, and various contrivances are used in order that on the excimer laser side, the pulse energy may be within the set value.

One technique therefor is the HI operation and the PGR operation described with reference to FIGS. 3 to 5, but on the exposure apparatus body side, there has been a problem that in the intervals indicated by times a and b in FIG. 5(A), the pulse energy exceeds the allowable value. These times a and b differ depending on the structure of the laser source, the maker, etc., and are of the order of several seconds to several minutes at present. Further, a serious disadvantage to the exposure apparatus side is that the intervals a and b, i.e., during the HI operation and the PGR operation, have been solely controlled by the laser source side.

Thus, if the HI operation or the PGR operation is effected non-synchronously during the exposure of one shot area (which usually requires tens pulses) when a wafer is to be exposed by the step and repeat system, great damage will be imparted to the exposure of almost all of many shots after that shot area, or the next shot area on the wafer.

Of course, when the excimer laser light is used for other purpose, for example, for the relative alignment of a reticle (negative) and a wafer, if the HI operation and the PGR operation take place during the alignment period, there occurs an alignment error.

SUMMARY OF THE INVENTION

It is an object of the present invention in an exposure apparatus using a laser source such as an excimer laser source which requires partial gas replacement, partial gas injection or the like, to minimize reductions in the function and accuracy of an exposure apparatus.

So, in the present invention, as shown in FIG. 1, the design is such that, for example, from a first control system (12) of a laser source (10) side, a signal (PGR. REQ) for informing a second control system (40) of the exposure apparatus body side that there has come a period for partial gas replacement or gas injection is output.

The second control system (40) checks the request signal (PGR.REQ) when the operation using the laser light is being interrupted in the sequence of the exposure apparatus, and outputs to the first control system (12) a signal (STEP.ST) representing that partial gas replacement or gas injection can be executed when said request signal is being output, and also continues the interruption of the sequence of the exposure apparatus until the output fluctuation of the laser light caused by said execution becomes stabilized in a predetermined state.

In the present invention, in order to avoid any deleterious fluctuation of the laser output on the exposure apparatus body side, caused by non-synchronous partial gas replacement or gas injection on the laser source side, the operations of partial gas replacement and gas injection are started at a timing when the laser light is not used in the exposure sequence (or the alignment sequence) on the exposure apparatus body side.

DESCRIPTION OF THE PREFERRED EMBODIMENTS

Figure 1A:
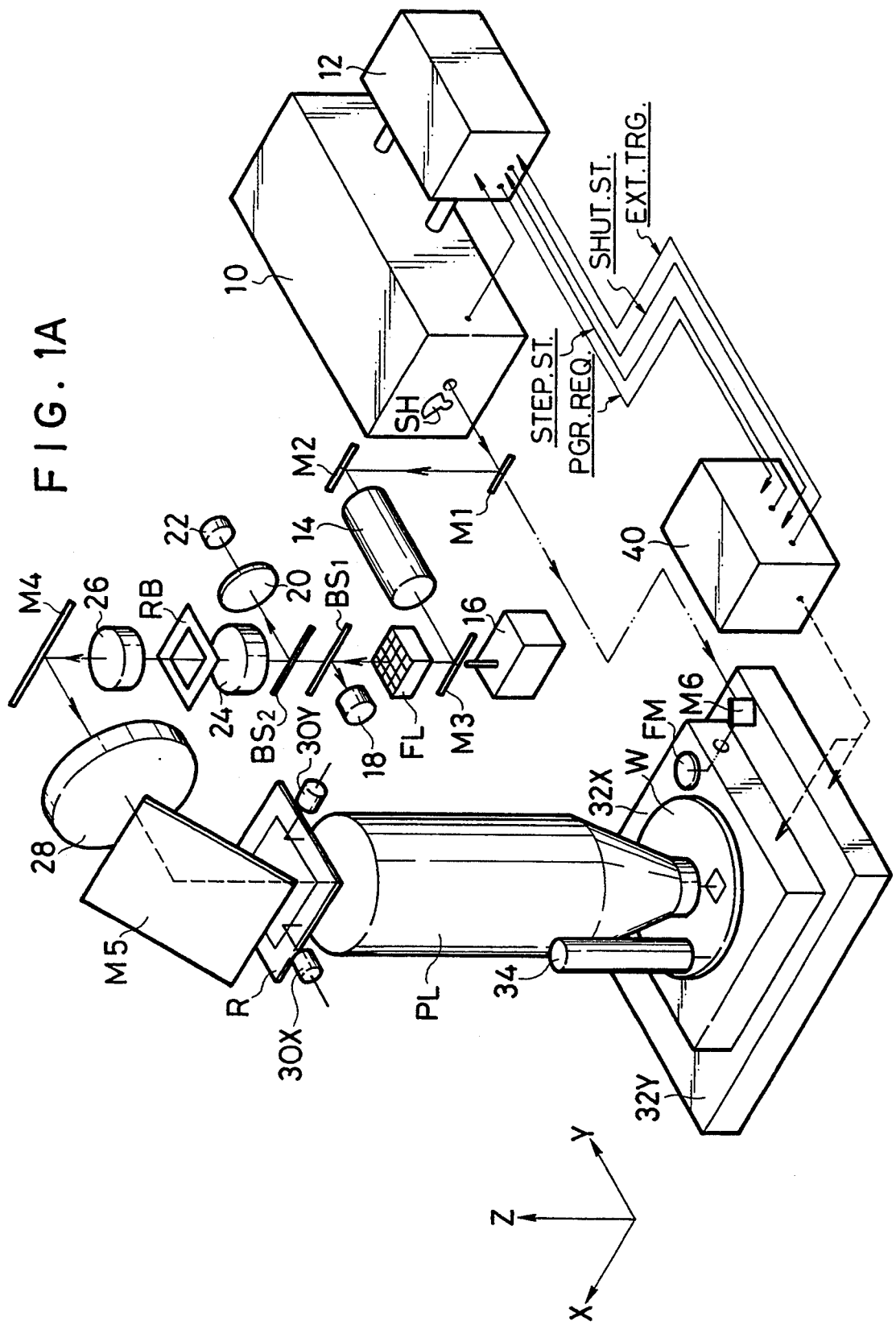
FIG. 1A hows the constructions of an exposure apparatus and a laser source according to an embodiment of the present invention.

FIG. 1A is a perspective view showing the construction of the entire exposure apparatus according to an embodiment of the present invention.

The reference numeral 10 designates the body unit of an excimer laser source in which there are provided a laser chamber in which mixed gas such as rare gas halide is enveloped, a front mirror (of the half-transmitting property) and a rear mirror for resonance, a wavelength selecting element (such as a diffraction grating, a prism or an etalon) for narrowing the wavelength, a spectroscope for monitoring the absolute value of the oscillation wavelength, a detector for monitoring the laser power, and a shutter SH. The HI operation and the PGR operation for the laser chamber are performed by a control system 12. In the present embodiment, independent control by only the processor in the control system 12 is not effected and cooperative control is effected by a connection with the exposure apparatus body. The control system 12 also effects control for the wavelength stabilization and control of the applied voltage for discharge.

The pulse light from the excimer laser device 10 enters a beam shaping optical system 14 via a movable mirror M1 and a fixed mirror M2 and is shaped into a predetermined cross-sectional shape and size. The pulse light from the beam shaping optical system 14 is reflected by an oscillatory mirror M3 oscillated within a predetermined angle by a driving unit 16, whereafter it enters a fly-eye lens FL which functions as an optical integrator, and is converted into a number of secondary light sources (spot light beams). The spot light beams of the excimer beam formed on the emergence side of the element lenses of the fly-eye lens FL are transmitted through beam splitters BS1 and BS2, and are superposed one upon another by a condenser lens system 24 so as to assume a substantially uniform intensity distribution on a reticle blind (illumination field stop) RB. The excimer light passed through the reticle blind RB illuminates the circuit pattern area of a reticle R via a lens system 26, a fixed mirror M4, a main condenser lens 28 and a fixed mirror M5. The reticle blind RB is made conjugate with the reticle R by the lens system 26 and the main condenser lens 28. The reticle R is positioned in X, Y and θ directions relative to the apparatus body by exclusive reticle alignment systems 30X and 30Y. The image of the circuit pattern of the reticle R is reduction-projected onto a wafer W by a projection lens PL. The wafer W is placed on an X stage 32X, which is moved in X direction on a Y stage 32Y which is moved in Y direction on a base. Thereby the wafer W is two-dimensionally moved along the projected image surface, and exposure of the step and repeat type or the like is effected. Also provided on the X stage 32X is a fiducial mark plate FM being substantially at the same level as the wafer W and having a transmitting type fiducial slit. A mirror (not shown) fixed to the X stage 32X is provided under the fiducial mark plate FM. This fiducial mark plate FM is disposed so as to receive the pulse light from the excimer laser source 10 from below via a plurality of mirrors and a mirror M6 fixed onto the Y stage 32Y when the movable mirror M1 is retracted from its shown position. The excimer beam entering the mirror M6 is a substantially parallel light beam and is parallel to the Y-axis, and is reflected perpendicularly to the X direction by the mirror M6 and is reflected vertically upwardly by the mirror under the fiducial mark plate FM. Accordingly, however the X stage 32X and the Y stage 32Y may be moved, the excimer beam enters the underside of the fiducial mark plate FM without fail.

The alignment (mark detection) of the wafer W is accomplished by an off-axis type wafer alignment system 34. The wafer alignment system 34 photoelectrically detects an alignment mark at a particular position on the wafer W by the use of an illuminating light (uniform illumination or spot light) of a wavelength range which does not sensitize the resist layer on the wafer W. Further, the wafer alignment system 34 is fixed in a predetermined positional relation with the projection lens PL, but because the relative positional relation between the center of detection of the mark on the wafer (the index mark or the spot light in the alignment system) and the center of the projected image of the circuit pattern on the reticle R becomes different each time the reticle R is replaced, the design is made such that the relative positional relation can be measured by the use of the fiducial mark plate FM. Therefore, the pulse light from a light-emitting slit in the fiducial mark plate FM is partly caused to branch off through the beam splitter BS2 disposed in the optical path of the illuminating system, and is received by a photoelectric element (such as a photomultiplier) 22 through a lens system 20. The light receiving surface of this photoelectric element 22 is disposed substantially conjugately with the pupil plane (the entrance pupil or the exit pupil) of the projection lens PL by lens systems 24, 26, 28, etc. Also, the images of a number of secondary light sources formed by the fly-eye lens FL are formed on the entrance pupil of the projection lens PL to thereby effect Kohler's illumination.

In the above-described construction, the partition wall of a thermal chamber for containing the exposure apparatus (stepper) body therein lies between the movable mirror M1 and the laser source device 10, and the laser source device 10 is installed outside the thermal chamber. Also, the stepper body is generally controlled by a main controller 40, and executes the movement of the X and Y stages 32X and 32Y, the positioning the reticle R by the reticle alignment systems 30X and 30Y, the operation of detecting the position of the wafer W by the wafer alignment system 34, the setting of the reticle blind RB, a series of operations of checking the relative positional relations using the photoelectric element 22 and the fiducial mark plate FM, the operation of controlling the exposure amount using the photoelectric element 18 receiving part of the pulse light reflected by the beam splitter BS1, and the operation of reducing the speckle by the oscillation of the oscillatory mirror M3 (such as interference fringes caused by the coherence of the excimer beam).

The positions of the X and Y stages 32X and 32Y are successively measured as coordinates values by a laser interference type measuring machine (an interferometer), and these coordinates values are also input to the main controller 40 for use for various position measurements. The above-described construction of the stepper side is merely an example in the present invention and is not restrictive.

In the present embodiment, four interface signals are newly provided between the main controller 40 of the stepper side and the control system 12 of the laser source side so that cooperative control can be accomplished. Of course, other interface signals are also provided as a matter of course, but only those related to the present invention are shown. The names and functions of the four interface signals are as follows.

Signal PGR. REQ. (PGR REQUEST)

This is the signal from the excimer laser source side to the exposure apparatus body, and is for informing the exposure apparatus body that the necessity of executing partial gas replacement (PGR operation) or halogen gas injection (HI operation) has become pressing, shown by varying the signal level (in the present embodiment, Lo→Hi). It also has the function of informing the exposure apparatus body of the termination of the partial gas replacement or halogen gas injection operation, shown by varying the signal level from Hi to Lo.

Signal STEP.ST. (STEPPER STATUS)

This is a level signal for commanding the operation mode from the exposure apparatus body to the excimer laser source, and when the signal level is Lo, the excimer laser source device 10 emits laser light pulses in synchronism with the signal EXT.TRG. from the exposure apparatus body. There are the following two operation modes of the excimer laser when this signal is at Hi. If this signal varies from Lo to Hi while the excimer laser source causes the signal PGR.REQ. to be Lo, that is, while there is no request for the execution of partial gas replacement or halogen gas injection to the exposure apparatus body, the excimer laser source closes the shutter SH lying in the laser light emission port, and self-oscillates at a suitable low frequency to thereby effect the locking of pulse energy, absolute wavelength, etc. Also, if this signal varies from Lo to Hi when the signal PGR.REQ. is at Hi, the excimer laser source closes the shutter SH and executes partial gas replacement or halogen gas injection.

Signal SHUT.ST. (SHUTTER STATUS)

This is a level signal from the excimer laser source to the exposure apparatus body which is indicative of the shutter position in the excimer laser, and in the present embodiment, it assumes Hi level for opening, and Lo level for closing. The timing at which the level is varied is such that when closing the shutter SH, the level is varied from Hi to Lo after the shutter SH has been completely closed, and that when opening the shutter SH, the level is varied from Lo to Hi after the shutter has been completely opened.

Signal EXT.TRG. (EXTERNAL TRIGGER)

This is a trigger signal from the exposure apparatus body to the excimer laser source which commands the emission of laser light, and the laser source side emits laser light by the edge detection of this signal. One trigger signal corresponds to the emission of one pulse of laser light.

In the present embodiment, the cooperative control of the laser source side and the stepper body side is effected on the basis of the above-described four interface signals.

The control operation of the present embodiment will now be described, but before that, a brief description will be given below of the exposure operation and the alignment operation using the excimer laser light in the stepper.

One shot area on the wafer W is exposed to light of several tens of pulses or more because of the relation between the reduction in speckles and the accuracy of exposure amount control. The reduction in speckles is effected by a system in which interference fringes on the image surface caused by the fly-eye lens FL being used are minutely moved in the direction of pitch thereof by oscillating laser pulses while deflecting the oscillatory mirror M3 by a minute angle for each pulse, and after the completion of the exposure of one shot, the contrast of the interference fringes on the wafer is suppressed to a practically uninfluential degree (to the order of ±1% as the contrast value). In this case, the angle of deflection (the one-half period) $\alpha$ of the oscillatory mirror M3 necessary to reduce the contrast of the interference fringes on the image surface (the wafer surface) and the number Np of laser light pulses necessary in that angle of deflection $\alpha$ are primarily determined by an experiment or the like.

The proper exposure amount Ev of one shot is also naturally determined by the kind, thickness, etc. of the resist and therefore, from the equilibrium with the pulse number K·Np (K being a natural number which increases by 1 at each one-half period of the angle of deflection $\alpha$ of the oscillatory mirror M3) necessary to reduce the speckles, it is necessary to set the average pulse energy Ep of each pulse by a light decreasing filter or the like and effect exposure. During exposure, the actual energy of each light pulse detected by the photoelectric element 18 is integrated and whether the proper exposure amount has been reached is monitored. Alternatively, a high-speed variable light decreasing filter may be provided short of the fly-eye lens FL, and while satisfying the conditions of the pulse number K·Np and the angle of deflection $\alpha$, the integrated value of the energy detected by the photoelectric element 18 during each light pulse emission may be compared with the target integrated value and the next light pulse emission may be finely adjusted by the high-speed variable light decreasing filter.

Figure 5:
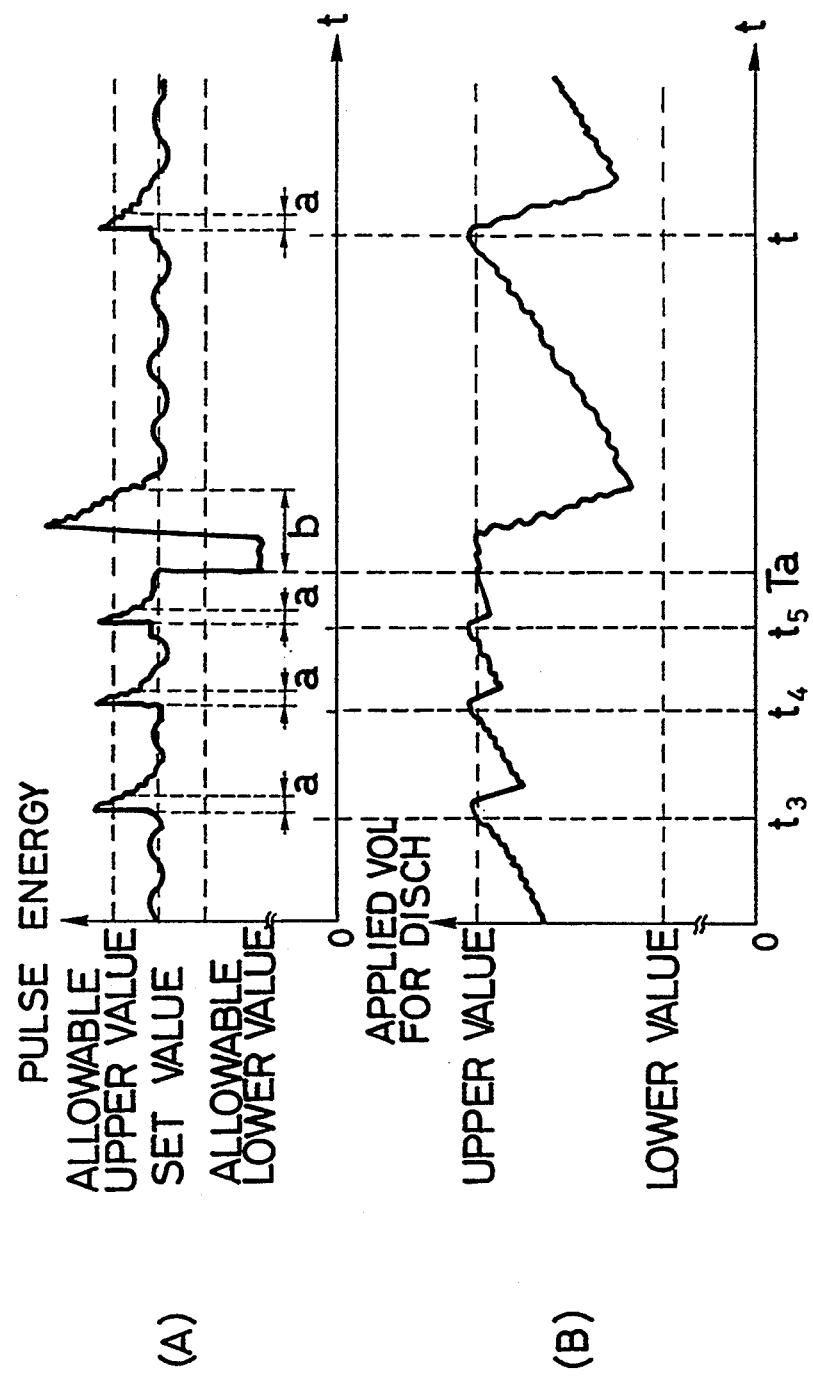
FIG. 5 is illustrating the operation during the execution of partial gas replacement.

The pulse number K·Np necessary to reduce the speckles is thus predetermined and therefore, when the time a shown in FIG. 5(A) begins before the pulse K·Np (K being one of 1, 2, 3, . . .) is reached during the exposure of one shot, the average energy Ep of the light pulse increases from that point of time, and this leads to the occurrence of the inconvenience that the proper exposure amount is reached before a sufficient reduction in the speckle contrast is effected. Particularly during the PGR operation, the amount of fluctuation of the pulse energy becomes greater as shown at the time b of FIG. 5(A), and this is very inconvenient for the reduction in the speckles and the control of the exposure amount.

Also, in the alignment operation using the excimer laser light, the transmitting slit in the fiducial mark plate FM is one-dimensionally moved in the projected image plane in a direction intersecting the lengthwise direction of the slit by the X and Y stages, the image of the slit is coupled to the transmitting slit mark on the reticle R, the excimer light transmitted through this slit mark is received by the photoelectric element 22 via the mirror M5, the condenser lens 28, the mirror M4, the lens systems 26, 24 and the beam splitter BS2, and the projected position of the slit mark of the reticle R is recognized on the movement coordinates system of the X and Y stages. At this time, the excimer laser source device 10 outputs the signal EXT.TRG. so as to oscillate pulses in response to the measurement pulse from the laser interferometer of the stepper side. Since the laser interferometer outputs a measurement pulse (up-down pulse) each time the X and Y stages 32X and 32Y are moved, e.g. by 0.01 μm, the main controller 40 suitably frequency-divides this measurement pulse and makes the signal EXT.TRG. The level of the photoelectric signal from the photoelectric element 22 is digitally sampled by an A/D converter after the oscillation of the pulse light, and is stored in a memory in the order of address during each light pulse emission. This address primarily corresponds to the coordinates position of the X and Y stages. However, the energy of the excimer laser light has irregularity of the order of ± several % to several tens of % for each pulse and therefore, it is necessary to introduce, for example, the photoelectric signal from a power detector in the excimer laser source device 10 during each light pulse emission, and normalize the level of the photoelectric signal of the photoelectric element 22 as by a divider. The detector for the normalization may be provided in the stepper body, and specifically, is provided so as to receive the pulse light caused to branch off by a beam splitter near the mirror M6 on the stage in FIG. 1.

By the above-described operation, the projected position of the slit mark of the reticle R (or the central point of the reticle) is prescribed as the value of the movement coordinates system of the X and Y stages. Further, the positions of the X and Y stages when the slit or the like in the fiducial mark plate FM is at the center of detection of the wafer alignment system 34 are read by the laser interferometer, whereby the relative positional relation in the movement coordinates system between the center of the projected image of the reticle R and the center of detection of the wafer alignment system 34 is obtained.

If the PGR operation or the like is started during such an alignment operation, particularly, when the photoelectric signal from the photoelectric element 22 is being introduced, the S/N ratio of the waveform of the introduced signal will be reduced, whereby the accuracy of alignment will be reduced.

Figure 1B:
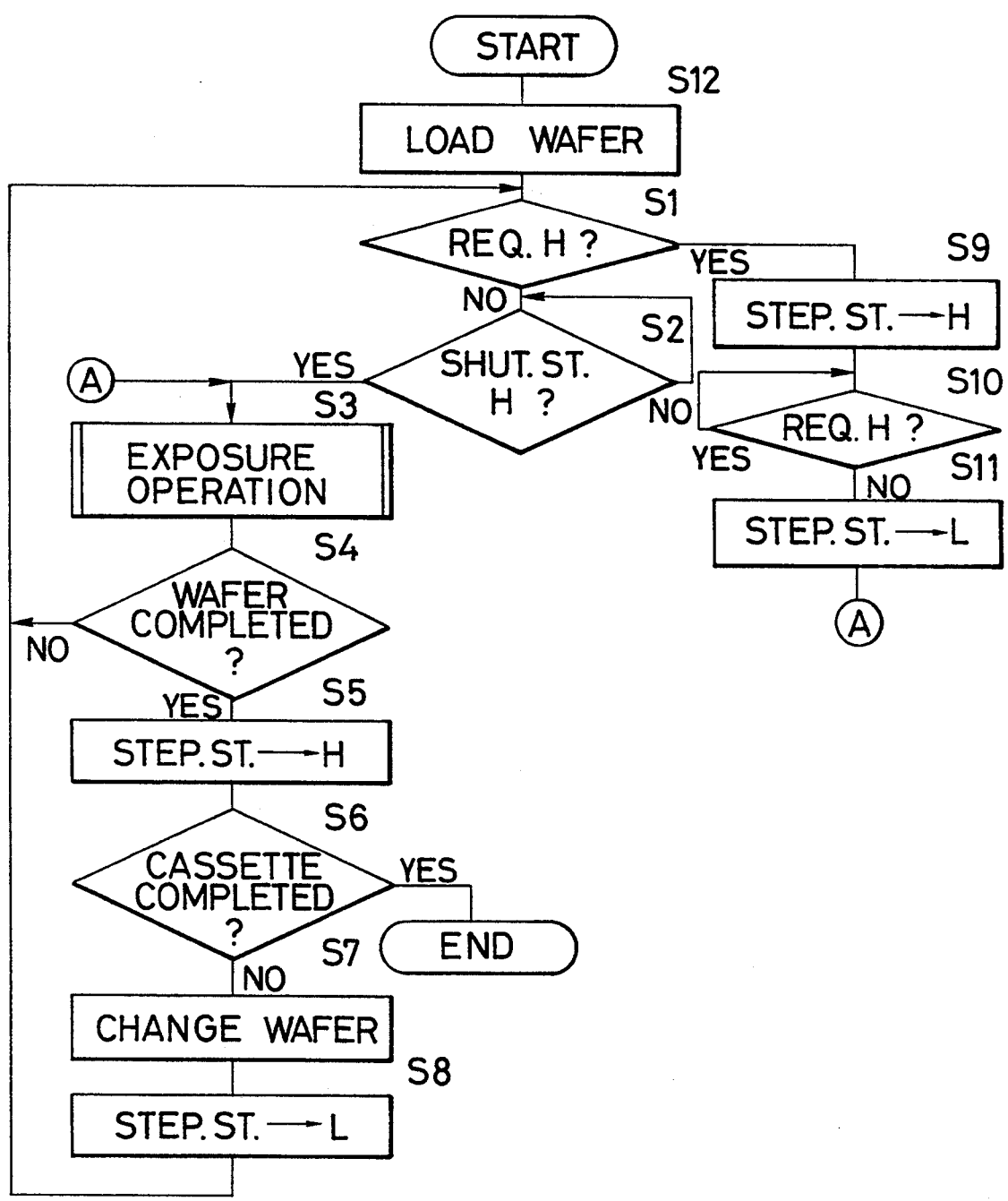
FIG. 1B is a flow chart showing the operation of a control system 12.
Figure 1C:
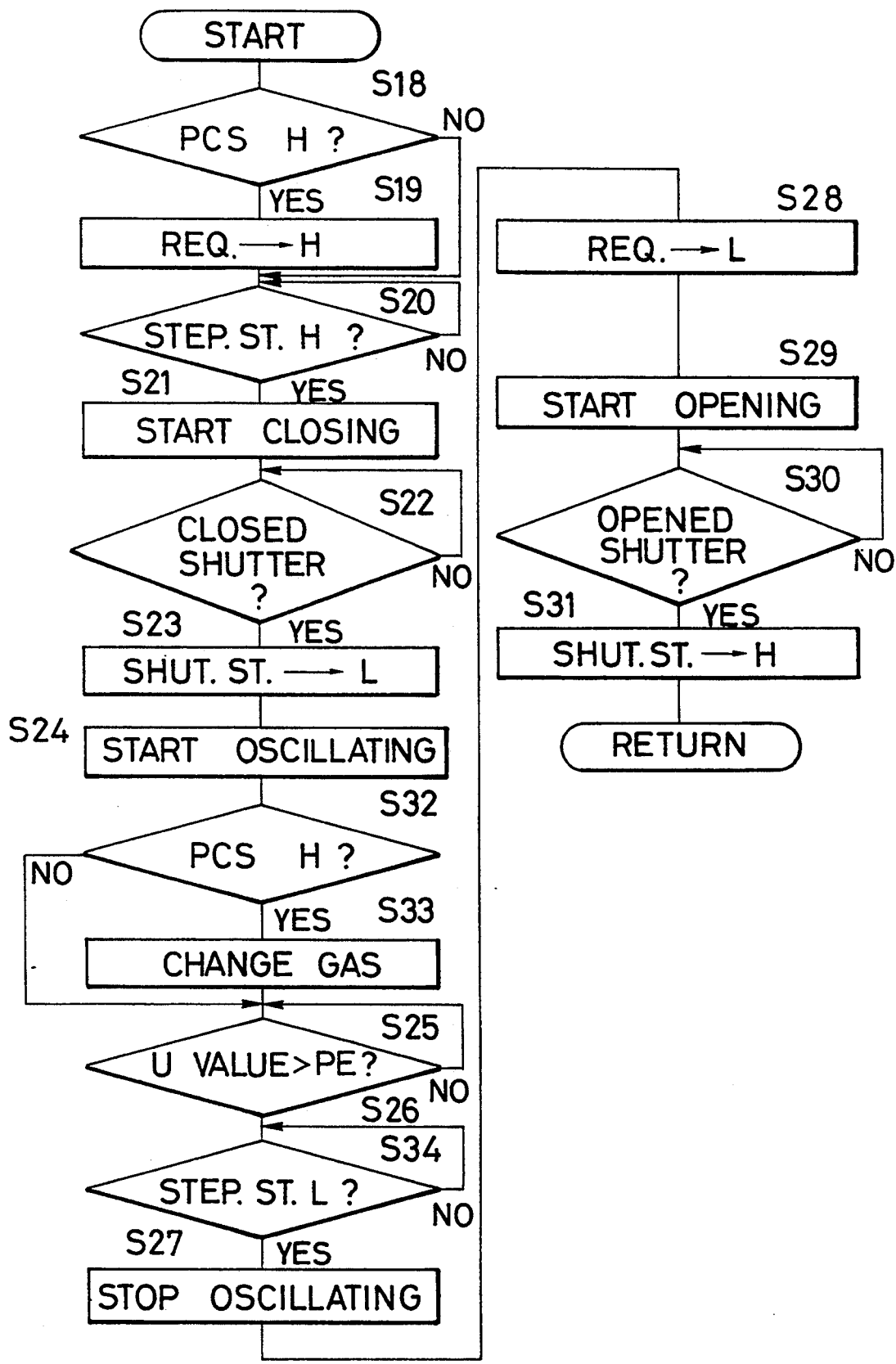
FIG. 1C is a flow chart showing the operation of a laser source device 10.
Figure 1D:
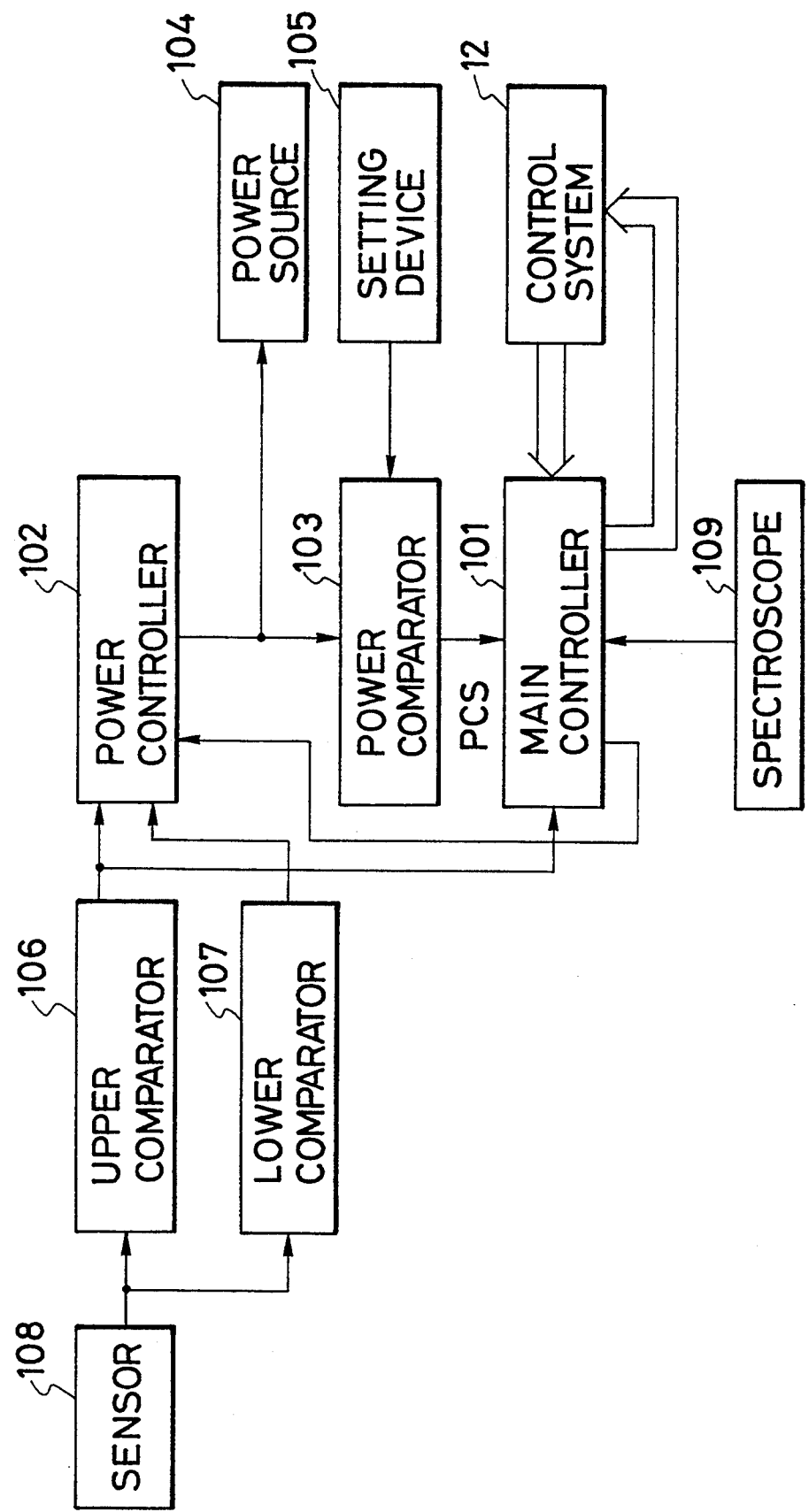
FIG. 1D is a block diagram showing part of the construction of the apparatus of the present invention.

FIG. 1D shows portions of the apparatus according to the embodiment of the present invention. A sensor 108 measures the pulse energy, and outputs the result of the measurement to an upper comparator 106 and a lower comparator 107. The upper comparator 106 compares the output of the sensor 108 with the allowable upper value shown in FIG. 2(A), and outputs a signal of Hi when the output of the sensor 108 is higher than the allowable upper value. The lower comparator 107 compares the output of the sensor 108 with the allowable lower value shown in FIG. 2(A), and outputs a signal of Hi when the output of the sensor 108 is lower than the allowable lower value. A power controller 102 controls a power source on the basis of the outputs from these two comparators. A power comparator 103 compares the control value of the power controller 102 with the set value of a setting device 105, and outputs a signal PCS of Hi to a main controller 101 when the control value is greater than the set value. The main controller 101 effects giving and taking of the signals STEP.ST., SHUT.ST., EXT.TRG. and REG.REQ. between it and the control system 12.

Figure 2:
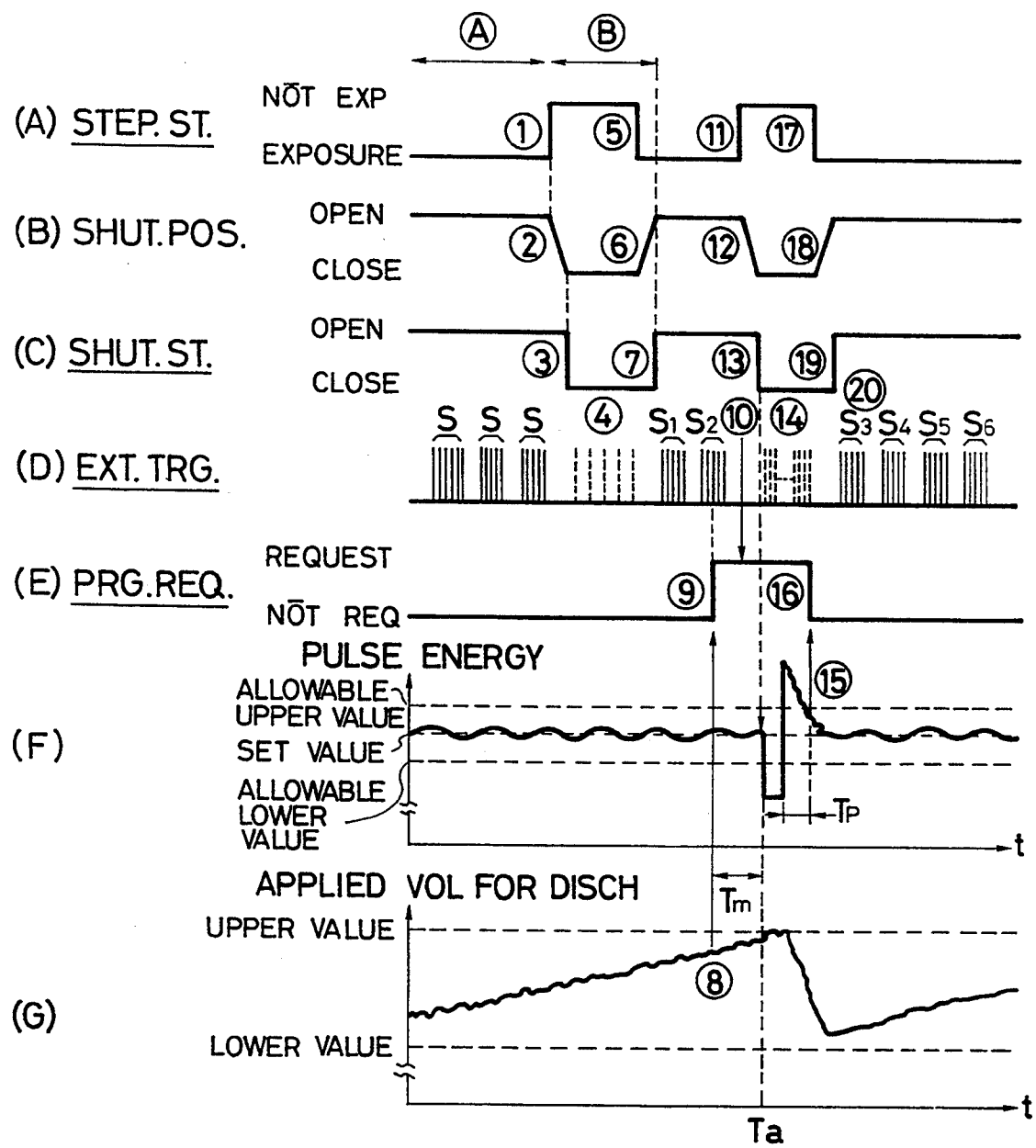
FIG. 2 is graphs illustrating an example of the operation by the construction shown in FIG. 1.
Figure 3:
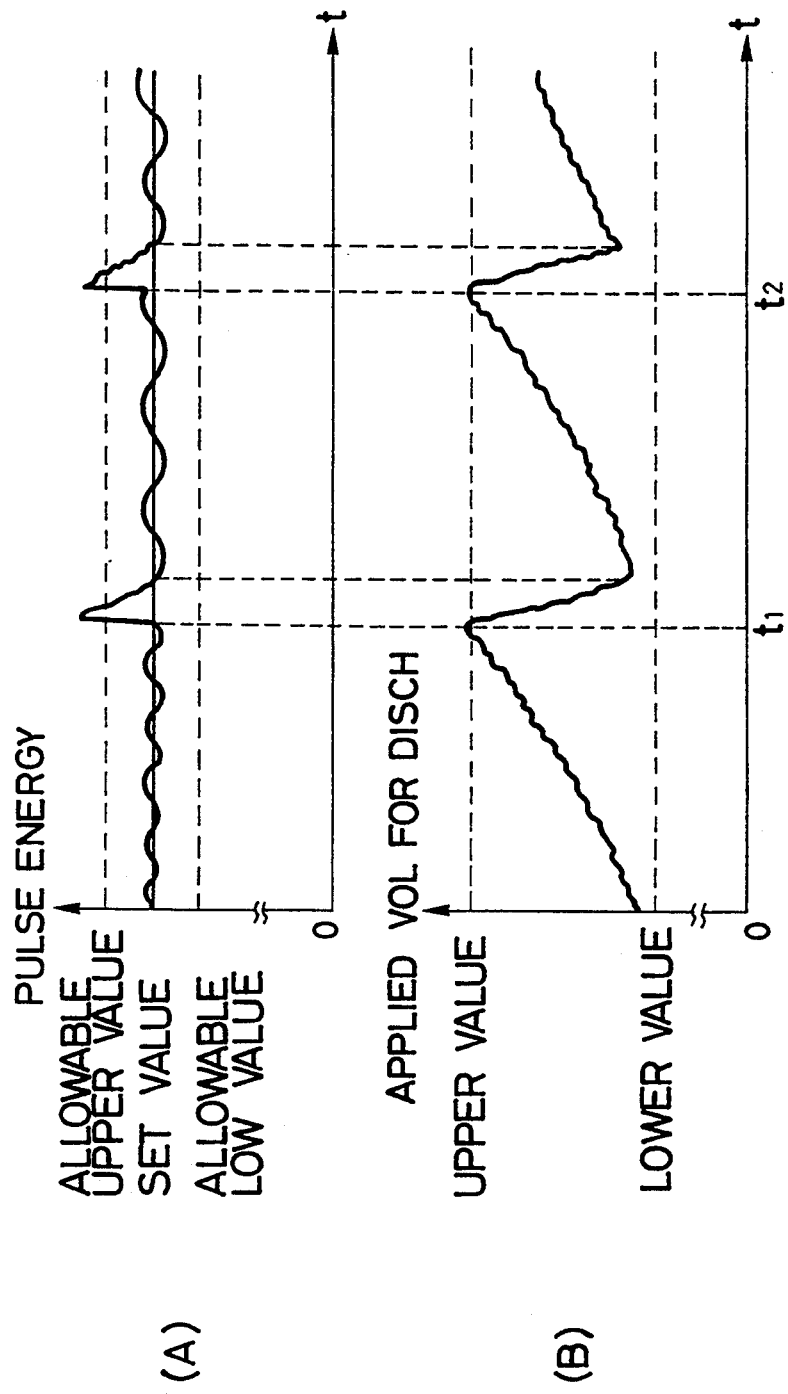
FIG. 3 is illustrating the operation during the execution of halogen gas injection.
Figure 4:
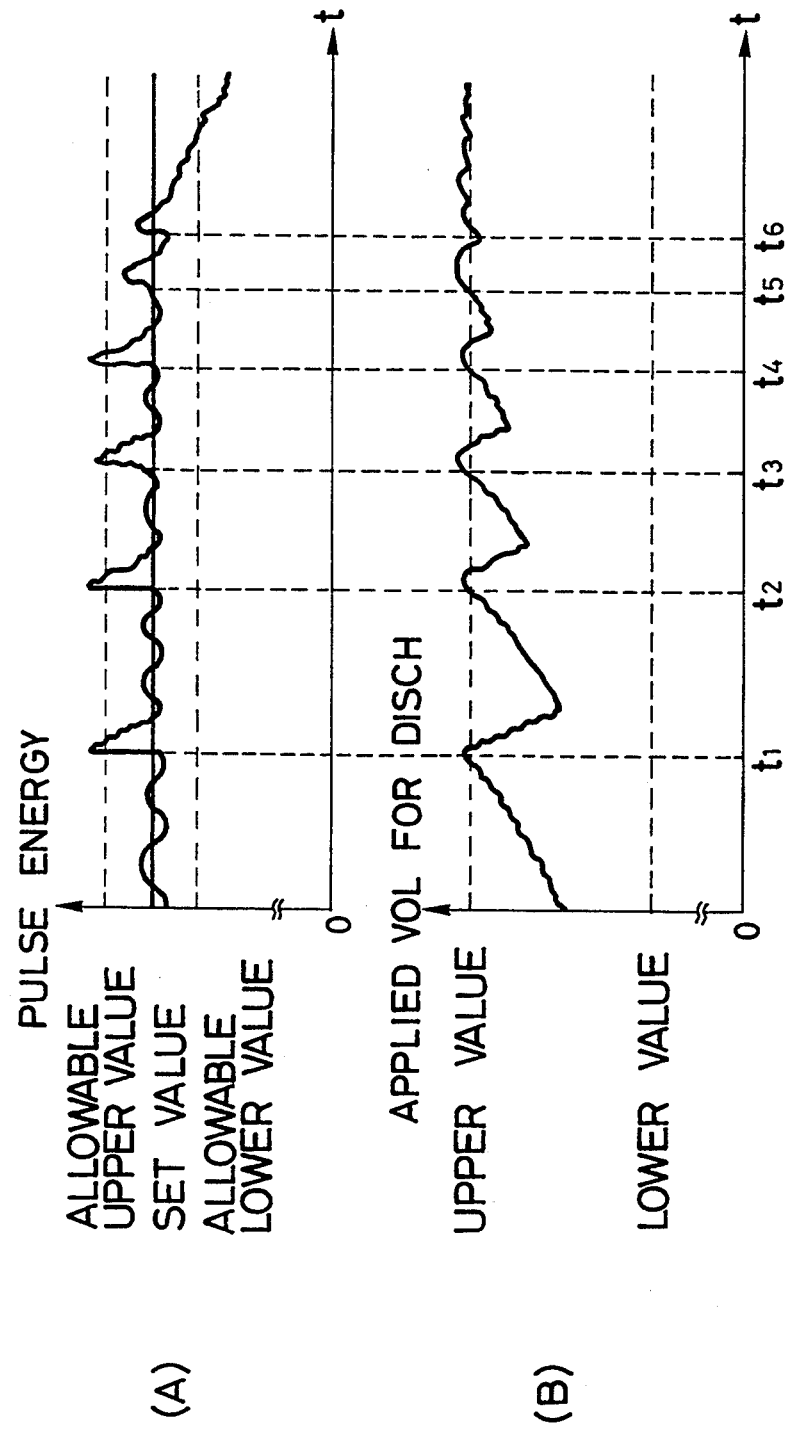
FIG. 4 is illustrating the operation during halogen gas injection when impurities in a laser chamber are increased.

The operation of the present embodiment will now be described with reference to FIGS. 1B, 1C and 2. FIGS. 2(A), (C), (D) and (E) show the states of the signal STEP.ST., the signal SHUT.ST., the signal EXT.TRG. and the signal PGR.REQ., respectively, and FIG. 2(B) shows the position of the shutter SH in the excimer laser source device 10. FIGS. 2(F) and (G) show the variation with time in the pulse energy and the variation with time in the applied voltage for discharge, respectively. Now, in FIG. 2(A), the period Â when the signal STEP.ST. is at Lo shows the execution of ordinary wafer exposure, and the period when the signal STEP.ST. is at Hi shows a state in which the stepper body is executing the operation of not delivering a light emission trigger to the excimer laser source for several or more seconds, for example, operations such as wafer replacement, the reticle alignment by the reticle alignment systems 30X and 30Y, and the wafer alignment by the wafer alignment system 34. During the period Â, exposure is repeated for a wafer at each shot by the step and repeat system, and at this time, the aggregate S of the trigger pulse trains of the signal EXT.TRG. shown in FIG. 2(D) corresponds to the exposure of one shot.

Now, the stepper, at a step S12, loads the stage with a wafer, and at a step S1, judges whether PGR. REQ. is at Hi level. At a step S2, it judges whether SHUT.ST. is at Hi level. Further, the stepper, at a step S3, exposes the wafer to light, and when the exposure for a wafer (period Â) is terminated (step S4), the stepper changes the signal STEP.ST. from Lo to Hi as indicated by (step S5). When the signal PCS of the power comparator 103 of FIG. 1D is at Lo, the excimer laser source device 10 which has recognized it at a step S20 begins to close the shutter SH at a step S21. ( ), and at a point of time whereat the shutter has been completely closed (steps S22 and S23), the excimer laser source device 10 renders the signal SHUT.ST. into Lo level ( ), whereafter at a step S24, it starts self-oscillation at a low frequency of several Hz or less ( ), and effects the locking (feedback control) of the pulse energy, the absolute wavelength, etc. During this time (period ), at a step S6, the stepper body judges whether the exposure of all the wafers in a cassette has been terminated, and if the exposure of all the wafers is not terminated, at a step S7, the stepper places the next wafer onto the stage. Thereafter, at a step S8, it changes the signal STEP.ST. from Hi to Lo ( ). The excimer laser source device which has recognized this at a step S34 stops its self-oscillation at a step S27, whereafter at a step S29, it begins to open the shutter SH ( ), and at a point of time whereat the shutter has been completely opened as shown at steps S30 and S31, it changes the signal SHUT.ST. from Lo to Hi ( ). The stepper body which has recognized this at the step S2 outputs the aggregates $S_1$, $S_2$, . . . of trigger pulse trains as the signal EXT.TRG. to start the exposure operation for the next wafer. The spaces between the pulse trains $S_1$ and $S_2$ represent times for the stepping of the X and Y stages 32X and 32Y.

Now, in non-synchronism with such operation sequence of the stepper body, there arises the necessity of the excimer laser source device executing partial gas replacement or halogen gas injection. Here is shown a case where partial gas replacement (the PGR operation) is executed. The stepper body checks the state of the signal PGR.REQ. before it starts the exposure of each shot area on the wafer, and effects exposure as indicated by the pulse trains S, $S_1$ and $S_2$ of FIG. 2(D) if that signal is at Lo. On the other hand, during the delivery of the trigger pulse train $S_2$, i.e., during the exposure of the second shot of the second wafer, the excimer laser source device detects at a step S18 by the Hi level of the signal PCS of the power comparator 101 that the applied voltage for discharge has approached the upper value ( ), and at a step S19, it changes the signal PGR.REQ. from Lo to Hi as the request for the execution of partial gas replacement ( ). As regards the timing for changing this signal PGR.REQ. from Lo to Hi, the comparison value of the comparator 103 may be set by the setting device 105 so that, for example, said timing may be earlier, by a time Tm which is the longest foreseeable exposure time necessary to expose one shot area (or the photoelectric signal introduction time during the photoelectric detection using the excimer beam) plus a margin, than the time Ta necessary for the last starting of partial gas replacement or halogen gas injection.

Now, here, the signal PGR.REQ. is changing during the exposure of the second shot area (during the delivery of the trigger pulse train $S_2$) and therefore, the stepper body checks the signal PGR.REQ. after it has caused X and Y stages 32X and 32Y to step to the next third shot area after the termination of the exposure of the second shot area, and recognizes at the step S1 that the signal PGR.REQ. has become Hi ( ⑩ ). Thereby, the sequence of the stepper body interrupts the start of the exposure of the third shot area, and at a step S9, changes the signal STEP. ST. from Lo to Hi ( ⑪ ). When at a step S20 the signal STEP.ST. has changed from Lo to Hi while the signal PGR.REQ. is at Hi, the excimer laser source device closes the shutter SH at a step S21 ( ⑫ ), and changes the signal SHUT.ST. from Hi to Lo at a step S23 ( ⑬ ), whereafter partial gas replacement is executed at a step S24 ( ⑭ ) while the excimer laser source device is self-oscillating at an appropriate frequency (for example, a higher frequency than in the case ④).

Thereafter, the excimer laser source device monitors the pulse energy PE and detects that the energy PE has become lower than the comparison value, U value, of the upper comparator 106 at a step S25 ( ⑮ ), and at a step S27, stops its self-oscillation, and changes the signal PGR.REQ. to Lo ( ⑯ ) if at the step S27, this signal is Hi. The stepper body which has recognized this at a step S10 changes the signal STEP.ST. from Hi to Lo at a step S11 as an exposure resumption command to the excimer laser source device ( ⑰ ). The excimer laser source device opens the shutter SH ( ⑱ ), and changes the signal SHUT.ST. to Hi ( ⑲ ). Thereafter, at a step S3, the stepper body delivers trigger pulse trains $S_3$, $S_4$ ... as the signal EXT.TRG., and starts the exposure of the third and subsequent shot areas ( ⑳ ).

In the present sequence, the PGR operation has been described above, and the HI operation is also executed entirely in the same manner. Further, where the excimer laser light is used in the alignment operation, the state of the signal PGR.REQ. is monitored on the stepper body side immediately before the photoelectric detecting operation for the pulse light is entered, and if it is at Lo, the photoelectric detecting operation is directly entered, and if it is at Hi, the excimer laser source side starts the PGR operation or the HI operation, and the stepper side preferentially executes the standby state or other operation which does not use the excimer laser light (wafer replacement, wafer alignment or the like).

Now, at ④ and ⑭ in FIG. 2(D), the pulse light is oscillated at a low frequency with the shutter SH closed, and one reason therefor is that it is necessary to make the spectroscope 109 in the excimer laser source device 10 detect any change in the wavelength after the band of the oscillated pulse light has been narrowed. Another reason is that in order to adjust the applied voltage for discharge along with the PGR operation and the HI operation, or in order to set the pulse energy for the next shot $S_1$, it is necessary to make a power monitor (a photoelectric element) provided in the excimer laser source device 10 receive the pulse light.

Also, the signal PGR.REQ. in the present embodiment is involved in the interruption or resumption of the exposure to the stepper and therefore, it is possible to detect by a spectroscope or the like that the absolute wavelength control or the spectrum half value width control (the band-narrowing) of the excimer laser source device 10 exhibits a behavior inconvenient to the stepper during partial gas replacement or halogen gas injection, and when inconvenient, to avoid the inconvenience by changing the signal PGR.REQ. to Hi. Also, when there is a request for execution by the signal PGR.REQ. in the present embodiment, and for the sequence being executed by the stepper body it is permissible to have fluctuation of the pulse energy caused by partial gas replacement or halogen gas injection, partial gas replacement or halogen gas injection may be executed without that sequence being interrupted and the shutter SH being closed. The design may also be such that with the request for partial gas replacement and the request for halogen gas injection as discrete signal lines, whether the sequence of the exposure apparatus body should close the shutter SH for each request for execution and execute each request is judged.

The shutter SH may be provided on the exposure apparatus body side. Also, for the occurrence of the request for execution by the signal PGR.REQ., the trigger of the laser light emission when partial gas replacement or halogen gas injection is effected with the shutter SH closed is, in the present embodiment, the self-oscillation from the excimer laser source side, but alternatively, the light emission may be effected by the trigger signal (EXT.TRG) from the exposure apparatus body.

Figure 7A:
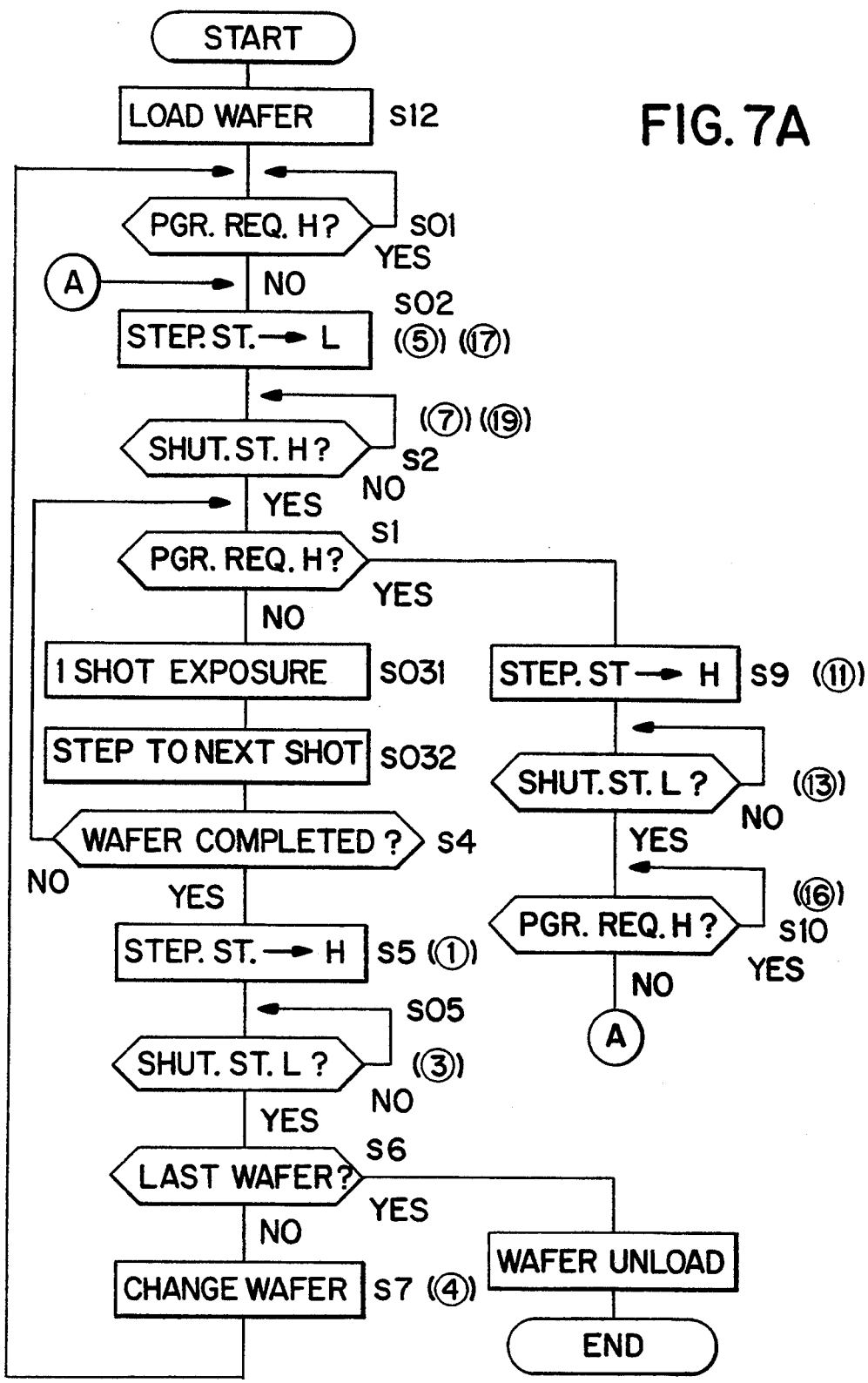
FIGS. 7A and 7B are flow charts showing the operation of a second embodiment of the invention.
Figure 7B:
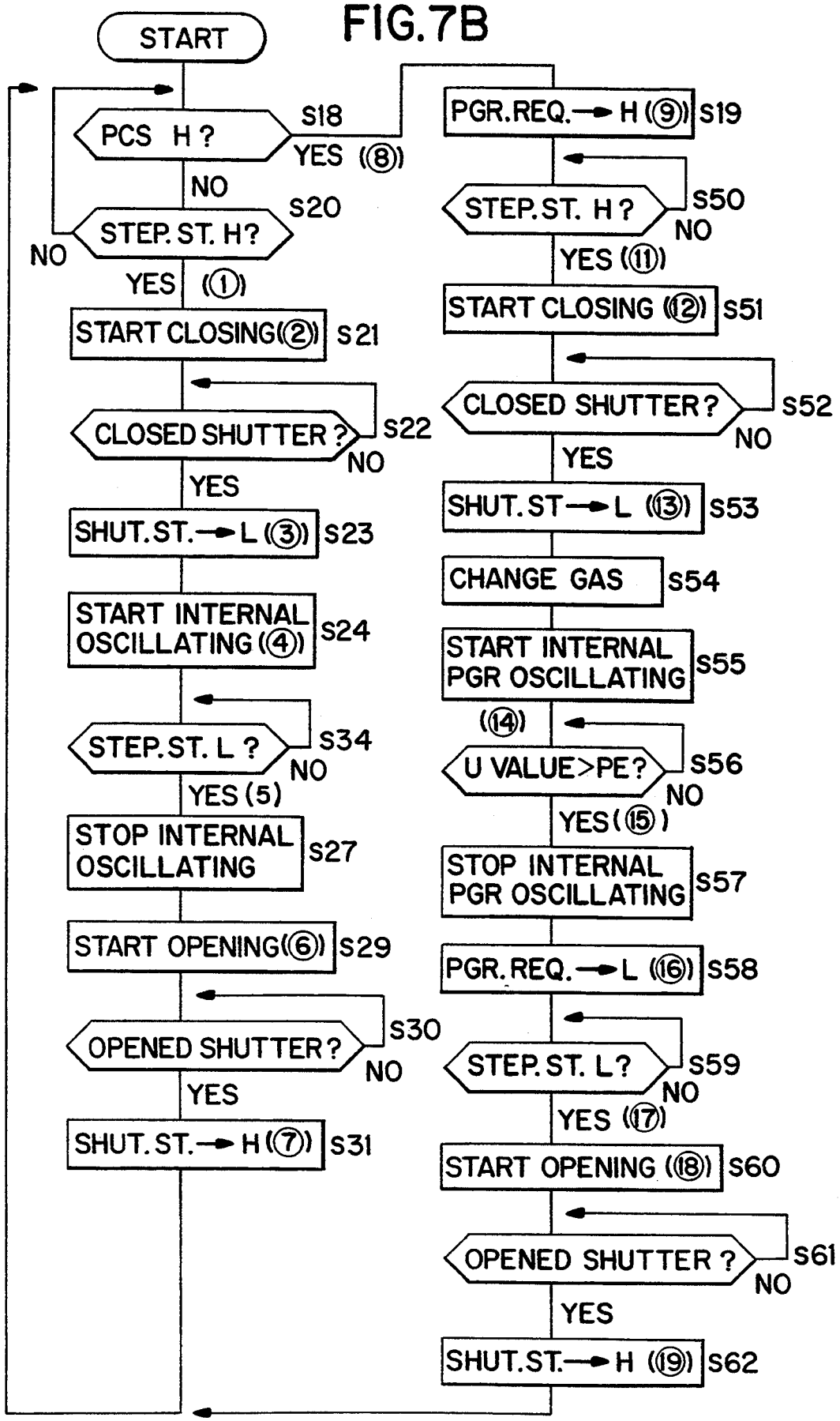

The operation of a second embodiment will now be described with reference of FIGS. 7A and 7B. In FIG. 7A, the stepper, at a step S12, loads the stage with a wafer, and at a step S01, judges the level of PGR.REQ. When the level of PGR.REQ. is Lo, the stepper changes the signal STEP.ST. from Hi to Lo (step S02). At a step S2, it judges whether SHUT.ST. is at Hi level. Further, the stepper, at a step S031, exposes the wafer to light, and when the exposure for a wafer (period Å) is terminated (steps S032 and S4), the stepper changes the signal STEP.ST. from Lo to Hi as indicated by (step S5). It is judged at step S18 whether PCS is Hi level or not. When the signal PCS of the power comparator 103 of FIG. 7B is at Lo, the excimer laser source device 10 which has recognized it at a step S20 begins to close the shutter SH at a step S21. ( ), and at a point of time whereat the shutter has been completely closed (steps S22 and S23), the excimer laser source device 10 renders the signal SHUT.ST. into Lo level ( ), whereafter at a step S24, it starts self-oscillation at a low frequency of several Hz or less ( ), and effects the locking (feedback control) of the pulse energy, the absolute wavelength, etc. If it is judged at step S05 that the signal SHUT.ST. is Lo level, the program proceeds to step S6. During this time (period ), at a step S6, the stepper body judges whether the exposure of all the wafers in a cassette has been terminated, and if the exposure of all the wafers is not terminated, at a step S7, the stepper places the next wafer onto the stage. Thereafter, the stepper judges the level of PGR.REQ. at the step S01 and it changes the signal STEP.ST from Hi to Lo at the step S02 ( ). The excimer laser source device which has recognized it at a step S34 stops its self-oscillation at a step S27, whereafter at a step S29, it begins to open the shutter SH ( ), and at a point of time whereat the shutter has been completely opened as shown at steps S30 and S31, it changes the signal SHUT.ST. from Lo to Hi (7). The stepper body which has recognized this at the step S2 outputs the aggregates $S_1$, $S_2$, ... of trigger pulse trains as the signal EXT.TRG. to start the exposure operation for the next wafer. The space between the pulse trains $S_1$ and $S_2$ is the stepping of the X and Y stages 32X and 32Y.

It is judged during an exposure at step S18 whether the output of the comparator 103 is Hi or not, and if it is Hi, the program proceeds to step S19. The signal PGR.REQ. is changed during the exposure of the second shot area (during the delivery of the trigger pulse train S in FIG. 2(D)) and therefore, the stepper body checks the signal PGR.REQ. after it has caused X and Y stages 32X and 32Y to step to the next third shot area after the termination of the exposure of the second shot area, and recognizes at the step S1 that the signal PGR.REQ. has become Hi ( (10) ). Thereby the sequence of the stepper body interrupts the start of the exposure of the third shot area, and at a step S9, changes the signal STEP.ST. from Lo to Hi ( (11) ). When at a step S50, the signal STEP.ST. has changed from Lo to Hi while the signal PGR.REQ. is at Hi, the excimer laser source device closes the shutter SH at a step S51 ( (12) ). The program proceeds to step S53 if it is judged at step S52 that the shutter is closed, and the signal SHUT.ST. is changed from Hi to Lo at step S53 ( (13) ), whereafter partial gas replacement is executed at steps S54 and S55 ( (14) ) while the excimer laser source device is self-oscillating at an appropriate frequency (for example, a higher frequency than in the case 4).

Thereafter, the excimer laser source device monitors the pulse energy PE and detects that the energy PE has become lower than the comparison value, U value, of the upper comparator 106 at a step S56 ( (15) ), and at a step S57, stops its self-oscillation, and changes the signal PGR.REQ. from Hi to Lo ( (16) ) at the step S58. The stepper body which has recognized this at a step S10 changes the signal STEP.ST. from Hi to Lo at a step S02 as an exposure resumption command to the excimer laser source device ( (17) ), and the program proceeds to step S60 if it is judged at step S59 that the signal STEP.ST. is Lo level. The excimer laser source device opens the shutter SH ( (18) ) at step S60, and if it is judged at step S61 that the shutter is opened, the signal SHUT.ST. is made Hi level at step S62 ( (19) ). Thereafter, the stepper body delivers trigger pulse trains $S_3$, $S_4$, ... as the signal EXT.TRG., and starts the exposure of the third and subsequent shot areas ( (20) ).

In the sequence shown in FIG. 2, the stepper side is adapted to check at timing 10 whether the signal PGR.REQ. is at Hi or Lo.

However, in the case of an exposed object which requires long-time exposure, the PGR (or HI) operation is started after a predetermined time Tm has elapsed after the signal PGR.REQ. has risen to Hi at timing as shown in FIGS. 2(E) and (F) and therefore, the time Tm must be set to a considerably long time. The lengthened time Tm means that the pulse energy of the laser light is reduced from the set value by the time when the PGR or HI operation is started.

Figure 6:
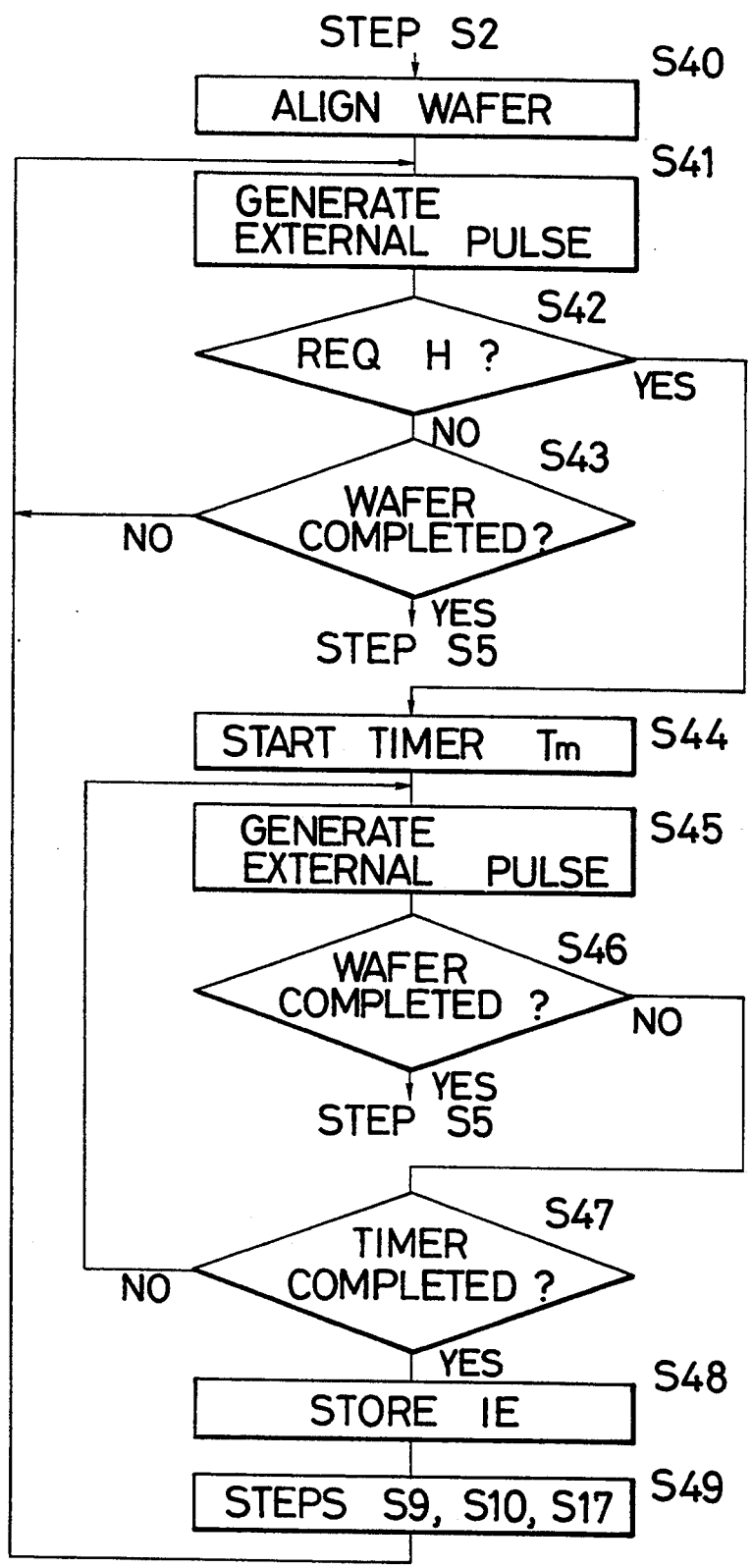
FIG. 6 shows a partly improved modification of the embodiment of the present invention.

So, a timer or the like is provided on the stepper body side, and as shown in the flow chart of FIG. 6, during the exposure of a certain shot, for example, in the interval between the light emission timings of successive light pulses, the state of the signal PGR.REQ. is checked at a step S42, and if it is at Hi level, the timer is started at a step S44 to count the time Tm. Whether the time Tm has come to an end when the exposure operation is still continued is checked at a step S47, and when the time Tm has come to an end, the PGR and HI operations are executed as in the previous embodiment. At a step S48, the exposure operation (the application of the pulse light) is forcibly interrupted the integrated exposure amount IE till then, the pulse energy (the average value), etc. is stored, and at a step S49, the PGR and HI operations are entered. After the completion of the PGR and HI operations, at a step S41, exposure is resumed until a proper exposure amount is obtained taking into consideration the stored integrated exposure amount IE. Thus, in the present invention, the very short time between the oscillation of light pulses is also included in the state in which the exposure operation is being interrupted the sequence of the exposure apparatus.

Also, the function of outputting a signal representative of the shot exposure state (shot status) may be provided on the stepper side, and the signal STEP.ST. of FIG. 2(A) may be made Hi by the AND (logic product) of this shot status signal and the signal PGR.REQ. that is, the design is such that the shot status signal assumes Lo level during the exposure of a certain shot and assumes Hi level at a timing which does not use the excimer laser, such as during the stepping between shots or during wafer replacement. Accordingly, when the signal PGR.REQ. assumes Hi level during shot exposure, the signal STEP.ST. immediately assumes Hi level at a point of time whereat the exposure of that shot has been completed, and the PGR and HI operations are started.

Now, during the PGR operation and the HI operation, the pulse energy tends to momentarily exceed the allowable upper value and become considerably great as shown in FIG. 5(A) or FIG. 2(F). A method which utilizes such tendency to further shorten the time until the resumption of exposure is also possible.

Generally, when during the PGR operation, it is judged by the power monitor that the pulse energy is too high, the applied energy for discharge is gradually reduced by minute steps. Therefore, it is difficult to detect by light emission of one pulse whether the applied voltage is above the allowable upper value, and suddenly reduce the applied voltage for discharge by foreseeing from the second and subsequent pulses.

So, as shown in FIGS. 2(F) and (G), the PGR operation on the excimer laser source side is left as it is, and a variable light decreasing filter is further provided on the stepper side, and the variation with time in the attenuation rate of this filter is controlled so as to substantially coincide with the pulse energy fluctuation characteristic within a time Tp in FIG. 2(F).

This variable light decreasing filter is automatically controlled so that the attenuation rate thereof may be gradually reduced (that is, the transmittance may increase) from a point of time whereat during the PGR operation, the pulse energy has reached its peak and so that the attenuation rate may become zero (the maximum transmittance of the filter) when the original pulse energy before entering the filter falls within the allowable value.

By doing so, exposure can be resumed more or less early even if the signal PGR.REQ. is in Hi state. For that purpose, it is of course necessary to change the opening-closing timing (SHUT.ST.) of the shutter SH in accordance therewith.

Where a variable light decreasing filter is used for a great fluctuation of the pulse energy, the shutter SH may be provided behind the variable light decreasing filter and the control of the attenuation rate thereof may be effected while the energy of the pulse light passed through the variable light decreasing filter is monitored and at the same time, the opening of the shutter SH may be executed.

Now, in FIGS. 2(F) and (G), the time Tm has been estimated with the longest exposure time of one shot as the reference, but use may be made of a length of time taking an exposure time corresponding to several shots into account so that in equilibrium with the number of remaining unexposed shots on a wafer, it may be judged whether the PGR operation and the HI operation should a wait the completion of the exposure process of a wafer, or whether the PGR operation, etc. should be entered during the treatment of a wafer.

Further, when the PGR operation is necessary, the applied voltage for discharge has reached the vicinity of the upper limit, but even if it remains at the upper value, during a certain number of pulses, the pulse energy can maintain a level above the allowable lower value and therefore, the time for interrupting the exposure operation, etc. may be determined with that taken into account.

In the present embodiment, there has been exemplarily shown an exposure apparatus in which the pattern of a reticle (or a mask) is printed onto the resist layer of a wafer, but even in a working apparatus using a laser source of this kind (such as laser anneal or laser repair), there arises an entirely similar problem and therefore, a similar effect can be obtained by the identical construction of the present invention.

While the present embodiment has been described with respect to a stepper using a projection lens, the present invention is equally applicable to an exposure apparatus of any other type. Further, the laser source has been described as an excimer using rare gas halide, but the use of another laser source which requires partial gas replacement, gas injection, gas circulation or the like in the laser chamber can also result in the obtainment of a similar effect.

As described above, according to the present invention, the laser source can execute partial gas replacement or gas injection (replenishment) in non-synchronism with the sequence of the exposure apparatus body and also, can avoid spoiling the performance of the exposure apparatus.

I claim:

1. An apparatus using a laser beam for processing a material, said apparatus comprising:
   (a) a gas laser source for generating a laser beam employed for processing the material, said gas laser source requiring the introduction of new gas from time to time in order to maintain a desired beam quality in accordance with said processing;
   (b) a processing machine for executing at least a material loading operation and a material processing operation;
   (c) first control means for establishing an operating sequence of said machine, said sequence including first intervals in which said processing machine requires the laser beam from said gas laser source and second intervals in which said processing machine does not require the laser beam from said gas laser source
   (d) detecting means for detecting when said gas laser source requires the introduction of new gas in order to maintain said desired beam quality and for transmitting a corresponding request signal to said first control means; and
   (e) second control means responsive to said request signal for ensuring that new gas is introduced to said gas laser source during at least one of said second intervals.

2. An apparatus according to claim 1, wherein the introduction of new gas causes fluctuation of the quality of said laser beam that diminishes with time, and wherein said second control means controls said operating sequence, after the introduction of new gas, to prevent the start of a first interval until the fluctuation of the quality of said laser beam has been reduced to a level at which the quality of said laser beam is stabilized.

3. An apparatus according to claim 1, wherein said new gas introduction comprises injecting additional gas into said laser source.

4. An apparatus according to claim 1, wherein said new gas introduction comprises partial replacement of the gas of said laser source.

5. An apparatus according to claim 1, further comprising shutter means opened and closed so that the beam from said laser source is passed and blocked, respectively, said shutter means producing an opening-closing signal that indicates whether said shutter means is open or closed, said second control means being responsive to said opening-closing signal in determining, after new gas introduction, when to start a first interval of said operating sequence.

6. An apparatus according to claim 1, wherein said detecting means monitors said laser beam and produces a request signal when the laser beam intensity is below a predetermined level.

7. An apparatus according to claim 1, wherein said beam quality is dependent upon an operating voltage of said laser source, and said detecting means detects said operating voltage.

8. An apparatus according to claim 1, further comprising spectroscope means for testing light from said laser source and for producing a request signal when said spectroscope means determines that the wavelength or spectrum of light from said laser source is inappropriate for said processing machine.

9. An apparatus according to claim 1, wherein said second control means includes means responsive to a request signal, during a first interval for interrupting that interval and for thereupon introducing new gas to said laser light source.

10. An apparatus according to claim 9, wherein said second control means includes means for storing a value corresponding to an amount of laser beam light already utilized by said processing machine during the interrupted interval before the interruption, and means for re-starting the interrupted interval after the introduction of new gas and for continuing the utilization of laser beam light for a period of time dependent upon the value stored.

11. An apparatus according to claim 9, wherein said second control means includes means for delaying said interrupting and the introduction of new gas for a predetermined time from said request signal.

12. An apparatus according to claim 1, wherein the introduction of new gas to said laser source causes the laser beam to exceed the desired beam quality and then to decrease with time according to a decreasing beam quality fluctuation characteristic, said apparatus further comprising variable filter means for modifying the laser beam of said laser source in accordance with a time-dependent decreasing attenuation that corresponds to said fluctuation characteristic so that the beam passed by said filter means is substantially devoid of said fluctuation characteristic.

13. An apparatus according to claim 12, further comprising shutter means operable in association with said filter means to control the amount of laser beam passed through said filter means.

14. An apparatus according to claim 1, wherein said laser source produces a series of laser beam pulses during each of said first intervals.

15. An apparatus according to claim 14, wherein said processing machine is a stepper.

16. An apparatus according to claim 15, wherein said laser light source includes an excimer laser.

17. An apparatus according to claim 1, wherein the laser beam of said laser source is dependent upon an operating voltage that is increased to compensate for reduction in beam intensity wherein said detecting means produces a request signal for the addition of gas to said laser source when said voltage reaches a predetermined level, and said second control means adds gas to said laser source and then reduces said operating voltage gradually.

18. An exposure apparatus comprising a gas laser assembly emitting a laser beam and a pattern exposure assembly for printing a pattern of a mask onto a sensitive plate with the laser beam, said gas laser assembly including a gas chamber, a gas renewing device for injecting new gas to the gas chamber or partially replacing gas of the chamber with new gas and a laser controller for controlling operation of the renewing device and the laser beam emission, said pattern exposure assembly including an assembly body disposed within a thermal chamber, said exposure apparatus also comprising an exposure controller for controlling said printing of the sensitive plate and positioning of the mask or the sensitive plate, said exposure apparatus further comprising:
(a) a first communication device for transmitting from said laser controller to said exposure controller a request signal requesting operation of said gas renewing device; and
(b) a second communication device for transmitting from said exposure controller to said laser controller a status signal indicating a time during which the laser beam is required by said exposure assembly;

said laser controller starting the operation of said gas renewing device when said status signal ceases to be transmitted and said request signal continues to be transmitted, said exposure controller interrupting an operation employing the laser beam in said exposure assembly while said gas renewing device is operating.

19. An apparatus comprising a gas laser assembly emitting a laser beam and a processing assembly treating a substrate with the laser beam, said gas laser assembly including a gas chamber and a gas renewing device for injecting new gas into the gas chamber or partially replacing gas of the chamber with new gas, said apparatus further comprising:
(a) a first control unit associated with said gas laser assembly for controlling emission of the laser beam and operation of said gas renewing device, said first control unit generating a request signal requesting the operation of said gas renewing device;
(b) a second control unit associated with said processing assembly for controlling a loading operation of the substrate and a treating operation of the substrate using the laser beam, said second control unit generating a status signal indicating an interval requiring the utilization of the laser beam in said processing assembly; and
(c) a communication device for transmitting said request signal to said second control unit and said status signal to said first control unit, wherein said first control unit starts operation of said gas renewing device when said status signal ceases to be generated while said request signal continues to be generated, and said second control unit interrupts operation of said processing assembly employing the laser beam while said gas renewing device is operating.

* * * * *